(12) United States Patent
Rockford

(10) Patent No.: US 7,579,070 B2
(45) Date of Patent: Aug. 25, 2009

(54) MULTIPLE LAYER DEPOSITION FOR IMPROVING ADHESION

(75) Inventor: Lee Rockford, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 11/216,829

(22) Filed: Aug. 30, 2005

(65) Prior Publication Data

US 2007/0048514 A1    Mar. 1, 2007

(51) Int. Cl.
*B32B 3/26* (2006.01)

(52) U.S. Cl. ............. 428/316.6; 428/319.1; 428/319.3; 428/319.7; 428/901

(58) Field of Classification Search ............. 428/316.6, 428/319.1, 319.3, 319.7, 901
See application file for complete search history.

(56) References Cited

U.S. PATENT DOCUMENTS 4,524,374 A * 6/1985 Denda et al. ................. 257/452
5,381,125 A * 1/1995 Chen et al. ................. 338/32 R
5,618,737 A * 4/1997 Robin et al. ................... 216/56
6,699,728 B2 * 3/2004 Guenther et al. .............. 438/39
6,819,540 B2 * 11/2004 Allen et al. ................. 361/302
2003/0104249 A1 * 6/2003 Okuno et al. ............... 428/693
2007/0003737 A1 * 1/2007 Khalaf et al. ............... 428/172

* cited by examiner

*Primary Examiner*—Hai Vo
(74) *Attorney, Agent, or Firm*—Blakely, Sokoloff, Taylor & Zafman LLP

(57) ABSTRACT

Methods to improve adhesion of a first material to a second material and electronics devices fabricated using such methods are described. A porous polymer layer is formed on a conductive layer. Forming the porous polymer layer leaves portions of the conductive layer exposed. A porous conductive layer is formed over the porous polymer layer and the exposed portions of the conductive layer. A continuous polymer layer is formed over the porous conductive layer. In one embodiment, the polymer layer includes a ferroelectric polymer, and the conductive layer includes a noble metal, e.g., gold.

8 Claims, 7 Drawing Sheets

US 7,579,070 B2

MULTIPLE LAYER DEPOSITION FOR IMPROVING ADHESION

FIELD

Embodiments of the invention relate generally to the field of fabrication of electronics devices, and more specifically, to polymer electronics devices.

BACKGROUND

Polymers with unique electronic properties are emerging as viable alternatives to inorganic materials for creating new and improved electrical and optical systems and products. The electrical and optical systems and products may be, e.g., memory and logic devices, optical and electrical interconnects, illumination and information displays; light and energy resources, detectors, sensors, actuators, lithography systems, and the like. Electronics devices may be fabricated as chips, which include thin layers of various materials formed on top of one another. The adhesion between these layers needs to be strong enough for manufacturing integration, proper operation, and sufficient lifetime of the electronics device.

To fabricate electrical contacts to polymers, noble metals are used. Noble metals are resistant to chemical reactions, particularly to oxidation and to solution by inorganic acids. The adhesion of the polymers therefore onto noble metals, is also weak due to chemically inactive nature of the noble metal. Poor, adhesion strength of polymers onto noble metals prevents successful incorporation of the polymer during manufacturing of an electronic device, as the interface can not withstand chemical or mechanical processing, elevated or low temperatures, used to fabricate the device. The polymer can peel off the metal, crack, or both.

FIG. 1 is a side view 100 of a prior art interface between a noble metal 101 and a polymer 102 with an adhesion promoter 103. Adhesion promoter 103 produced, e.g., by Rohm & Haas, Inc; JSR, Inc.; or SRI, Inc, is an isolative material, which is different from noble metal 101 and polymer 102.

Addition of the isolative adhesion promoter 103 between the noble metal and polymer, however, significantly compromises the electrical performance of the electrical contact, which can render it unacceptable for the electronics device operation.

For the reasons described above, to fabricate, e.g., a ferroelectric memory capacitor, adhesion promoter 103 is not used at the interface between a ferroelectric polymer and a gold substrate. The interfacial adhesion measured by the four-point bend crack growth technique produces an interfacial adhesion energy less than 1.5 joules/meter^2. This value is much lower than the minimum adhesion energy required for successful processing and integration of the polymer electronics device into a semiconductor package. A device having such a low interfacial adhesion energy can not survive thermal, chemical, and mechanical stresses, e.g., high temperatures, wet cleaning, and other conditions that occur during the manufacturing and integration operations.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
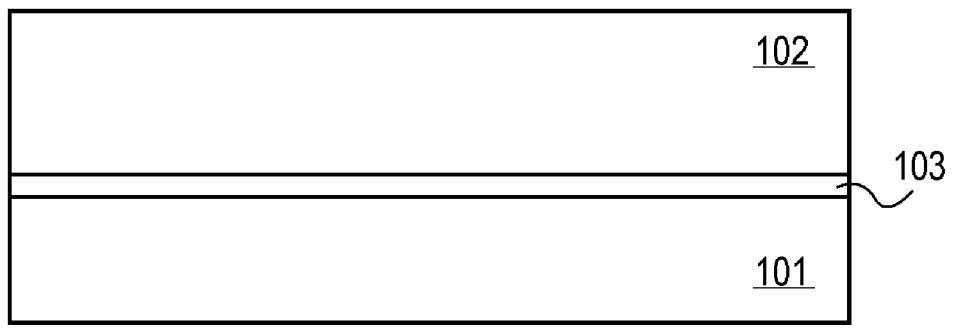
FIG. 1 is a side view of a prior art interface between a noble metal and a polymer with an adhesion promoter.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

Methods to improve adhesion of a polymer to a conductive material and electronics devices fabricated using such methods are described. A porous polymer layer is formed on a conductive layer. Forming the porous polymer layer leaves portions of the conductive layer exposed. A porous conductive layer is formed over the porous polymer layer and the exposed portions of the conductive layer. Forming the porous conductive layer leaves portions of the porous polymer layer exposed. A polymer layer is formed over the porous conductive layer. The polymer layer is formed on the porous conductive layer and the exposed portions of the porous polymer layer. Each of the porous conductive and polymer layers may be substantially thin, as described in further details below. Each of the conductive and polymer layers may be substantially thick, as described in further details below.

Subsequent formation of the porous polymer layer and the porous conductive layer on the thick conductive layer provides artificial, mechanical interfacial mixing between the polymer and a conductive material without chemically intermixing the polymer and the conductive material. As such, a polymer layer, which is formed on the porous conductive and polymer layers, has increased adhesion to the thick conductive layer. The interfacial adhesion energy between the polymer layer and the conductive layer is increased without using other materials, such as adhesion promoters. The interfacial adhesion energy may be measured using four-point bend measurement test. For example, the interfacial adhesion energy of a layer of a ferroelectric polymer deposited onto a gold substrate using a method as described above, is at least 5 joules/meter^2. This value exceeds the minimum value for interfacial adhesion energy required for successful processing and integration of the device into a semiconductor package. Such an electronics device can survive manufacturing processing and integration into the semiconductor package. Additionally, the performance of the device is not compromised.

Figure 2:
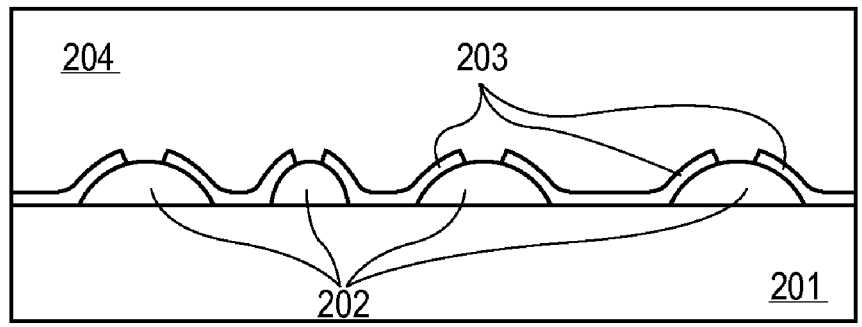
FIG. 2 is a side view of one embodiment of an interface between the first material and the second material.

FIG. 2 is a side view 200 of one embodiment of an interface between the polymer and the conductive material. As shown in FIG. 2, a porous polymer layer 202 is formed onto a conductive layer 201. Porous polymer layer 202 has a morphology that exposes some portions of conductive layer 201 and covers other portions of conductive layer 201, as shown in FIG. 2. A porous conductive layer 203 is formed on porous polymer layer 202 and exposed portions of conductive layer 201. Porous conductive layer 203 has a morphology that exposes portions of porous polymer layer 202, as shown in FIG. 2. A polymer layer 204 is formed on porous conductive layer 203 and on exposed portions of porous polymer layer 202, as shown in FIG. 2. As such, mechanical intermixing between the polymer material of layer 204 and conductive material of layer 201 is provided using porous polymer layer 202 and porous conductive layer 203, as shown in FIG. 2. In one embodiment, a polymer material for a polymer layer may include a ferroelectric polymer, e.g., polyvinylidene fluoride-co-trifluoroethylene ("PVDF-TrFE"), and a conductive material for a conductive layer may include gold. In another embodiment, the polymer material for polymer layer may be polystyrene.

In one embodiment, the thickness of porous layer of PVDF-TrFE may be in the approximate range of 0.1 nanometers ("nm") to 100 nm, the thickness of porous layer of gold may be in the approximate range of 30 angstrom ("Å") to 200 Å. More specifically, the thickness of porous layer of PVDF-TrFE may be in the approximate range of 0.1 nm to 10 nm and the thickness of porous layer of gold may be in the approximate range of 30 angstrom ("Å") to 100 Å.

In one embodiment, a conductive layer may include a noble metal, or a noble metal containing alloy. In one embodiment, a conductive layer may include a metal, e.g., gold ("Au"), platinum ("Pt"), palladium ("Pd"), any combination thereof, or any combination of alloys thereof. In one embodiment, a polymer layer may include a fluorinated polymer including carbon, hydrogen, and fluorine. In one embodiment, a polymer material of the polymer layer may be a ferroelectric polymer, a piezoelectric polymer, or any combination thereof, to fabricate a memory device. In alternate embodiments, each of the continuous conductive layer and porous conductive layer may include silver ("Ag"), gold ("Au"), nickel ("Ni"), titanium ("Ti"), tantalum ("Ta"), aluminum ("Al"), zinc ("Zn"), titanium oxide ("TiO2"), titanium nitride ("TiN"), or any other material known to one of ordinary skill in the art of electronics device fabrication to produce electrodes and each of the porous polymer layer and the continuous polymer layer includes fluorinated polymer including carbon, hydrogen, and fluorine.

Figure 3A:
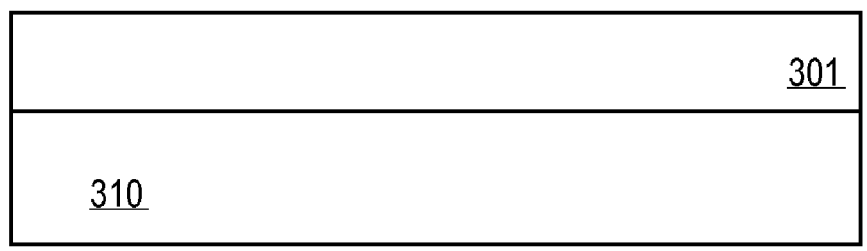
FIG. 3A is a side view of one embodiment of a structure to fabricate an electronics device.

FIG. 3A is a side view 300 of one embodiment of a structure to fabricate an electronics device. As shown in FIG. 3A, a conductive layer 301 is formed on a substrate 310. In one embodiment, conductive layer 301 may include a noble metal, such as Au, Pt, Pd, any combination thereof, or alloys thereof. In one embodiment, conductive layer 301 is a noble metal, or a noble alloy. In another embodiment, conductive layer 301 includes one or more metals known to one of ordinary skill in the art of electronics device fabrication. In one embodiment, substrate 310 includes a metal. In another embodiment, substrate 310 includes silicon. In yet another embodiment, substrate 310 includes silicon oxide. In alternative embodiments, substrate 310 includes any one, or a combination of, silicon, sapphire, silicon dioxide, silicon nitride, or other materials known to one of ordinary skill in the art of electronics device fabrication. In alternate embodiments, conductive layer 301 is formed on substrate 310 by sputtering, evaporation, spin coating ("casting"), or by using any other technique known to one of ordinary skill in the art of electronics device fabrication. In one embodiment, conductive layer of gold is sputtered onto substrate 310 including silicon and a metal diffusion barrier. Sputtering techniques are known to one of ordinary skill in the art of electronics device fabrication. In one embodiment, conductive layer 301 of gold is formed to the thickness in the approximate range of 100 Å to 2000 Å.

Figure 3B:
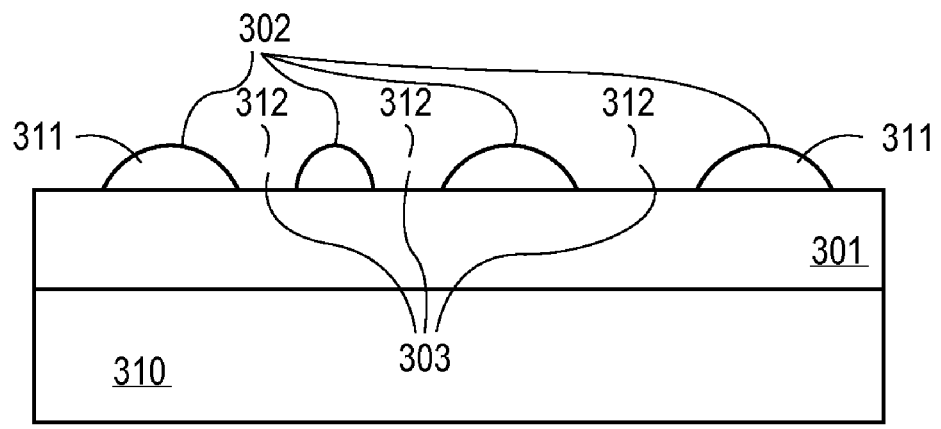
FIG. 3B is a view similar to FIG. 3A, after a porous polymer layer is formed on a conductive layer.

FIG. 3B is a view 300 similar to FIG. 3A, after a porous layer 302 of a polymer is formed on conductive layer 301. As shown in FIG. 3B, porous layer 302 has portions 311 covering conductive layer 301 and portions 312 exposing portions 303 of conductive layer 301. In one embodiment, exposed portions 303 of conductive layer 301 have the size in the approximate range of 0.1 nm to 10 nm. To form porous layer 302, a dilute solution of a polymer is deposited on conductive layer 301 to form porous layer 302 having the uniform thickness. The thickness of layer 302 may be in the approximate range of 0.1 nm to 100 nm. More specifically, the thickness of layer 302 may be in the approximate range of 0.1 nm to 10 nm. In one embodiment, the dilute solution of the polymer is spin cast and then annealed ("baked") on conductive layer 301 to form an ultra thin porous layer. Spin casting and baking are known to one of ordinary skill in the art of electronics device fabrication. Spinning and baking conditions, for example, the spinning speed, baking temperature and time, are chosen so that layer 302 of the polymer on conductive layer 301 is transferred from contiguous to porous form. The baking temperature is below the melting point of the polymer of layer 302. For example, to form porous layer 302 of polyvinylidene fluoride-co-trifluoroethylene ("PVDF-TrFE"), the baking temperature is below 150C. In one embodiment, a dilute solution of a ferroelectric polymer, e.g., polyvinylidene fluoride-co-trifluoroethylene) (PVDF-TrFE), is spin cast and baked on a gold substrate. To form a dilute solution of the polymer, e.g., PVDF-TrFE, 1 to 10 weight percent of the polymer in dissolved in a solvent, e.g., Diethyl Carbonate, propylene glycol monoether acetate ("PGMEA"), Propyl Acetate, Acetone, N-methyl pyrrolidone, Dimethylformamide, or Dimethylacetamide. The spinning speed to deposit porous layer 302 of the dilute solution of polymer, e.g., PVDF-TrFE, on conductive layer 301 of gold is in the approximate range of 2000 revolutions per minute ("rpm") to 4000 rpm, the baking temperature is in the approximate range of 120 C to 150 C, and baking time is in the approximate range of 10 seconds to 200 seconds. In another embodiment, the dilute solution of the polymer may be evaporated onto conductive layer 301 to form porous layer 302. Evaporating the polymer is known to one of ordinary skill in the art of electronics device fabrication. In one embodiment, forming porous layer 302 on conductive layer 301 may be controlled using an Atomic Force Microscope ("AFM"), a Scanning Electron Microscope ("SEM"), or both. In one embodiment, forming a porous layer 302 on conductive layer 201 can be performed through controlled selective decomposition of one component of a blend or block copolymer film.

Figure 3C:
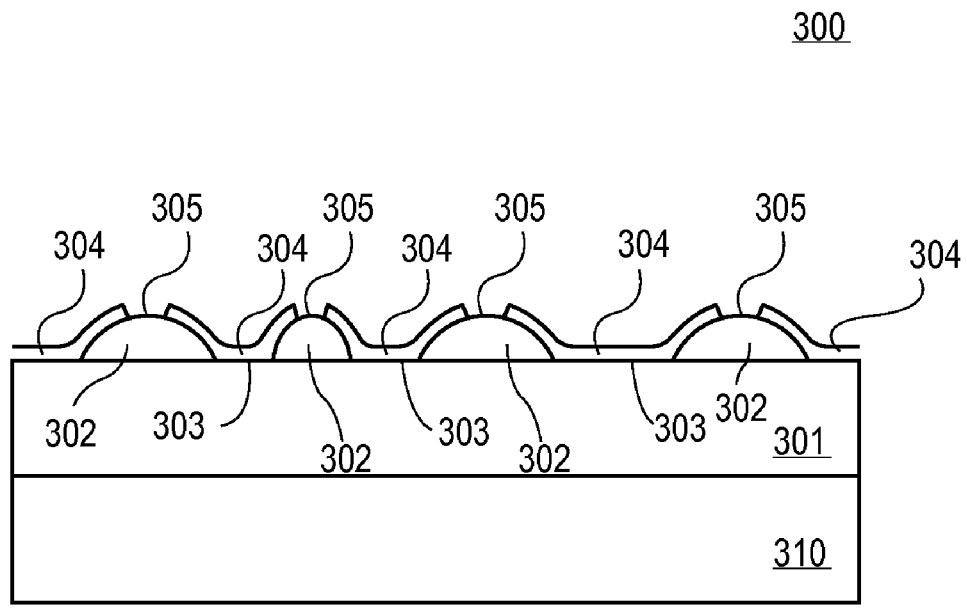
FIG. 3C is a view similar to FIG. 3B, after a porous conductive layer is formed over the porous polymer layer.

FIG. 3C is a view 300 similar to FIG. 3B, after a porous layer 304 of a conductive material is formed over porous layer 302 of a polymer. As shown in FIG. 3B, porous layer 304 of the conductive material has a morphology, such that portions 305 of porous layer 302 of the polymer are exposed. In one embodiment, exposed portions 305 of porous layer 302 have the size in the approximate range of 1 Å to 100 Å. Porous layer 304 of a conductive material is formed over porous layer 302 of the polymer, such that continuous ("non-porous") portions of porous layer 304 are deposited on the porous layer 302 and on the exposed portions 303 of conductive layer 303.

In one embodiment, a conductive material for porous layer 304 may be a noble metal, or a noble metal containing alloy. In one embodiment, the conductive material for porous layer 304 is the same as the conductive material for conductive layer 301. In one embodiment, the conductive material for porous layer 304 is gold, or platinum. In one embodiment, porous layer 304 is formed by thermal evaporation onto the porous layer 302 of the polymer and onto exposed portions 303 of conductive layer 301. Atoms of the conductive material diffuse into porous layer 303 and into exposed portions 303 and aggregate into grains or small domains that form porous layer 304. The temperature to perform thermal evaporation for depositing porous layer 304 depends on a metal and depositing conditions, e.g., degree of vacuum in the deposition chamber. In another embodiment, porous layer 304 is formed by sputtering the conductive material onto porous layer 302 and exposed portions 303 of conductive layer 301. Thermal evaporation and sputtering techniques for depositing a metal onto a substrate are known to one of ordinary skill in the art of electronics device fabrication.

As shown in FIG. 3C, one part of a continuous portion of porous layer 304 is on porous layer 302 of a polymer and other part of the continuous portion of porous layer 304 is on exposed portions of the surface of conductive layer 301 that provides anchors to another polymer layer formed over porous layer 304 later on in the process. In one embodiment, porous layer 304 of gold deposited over porous layer 302 of PVDF-TrFE on conductive layer 301 of gold, has the thickness in the approximate range of 10 Å to 100 Å. More specifically, the thickness of porous layer 304 of gold is in the approximate range of 50 Å to 80 Å.

Figure 3D:
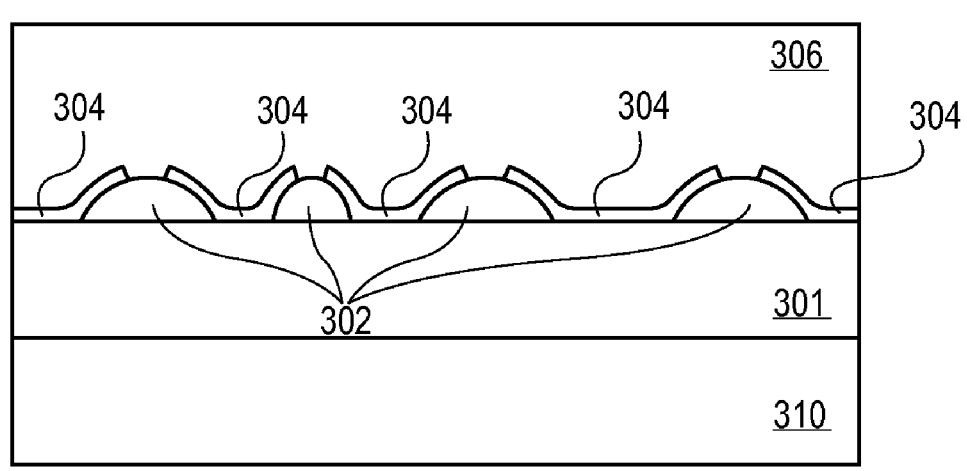
FIG. 3D is a view similar to FIG. 3C, after a continuous polymer layer is formed over the porous conductive layer.

FIG. 3D is a view 300 similar to FIG. 3C, after a continuous ("non-porous") layer 306 of a polymer is formed over porous layer 304 of a conductive material. As shown in FIG. 3D, continuous layer 306 of the polymer is deposited onto porous layer 304 of the conductive material and onto exposed portions 305 of porous layer 302 of the polymer. Porous layer 304 of conductive material forms an anchoring layer in the polymer providing mechanical intermixing that increases the interfacial adhesion between polymer layer 306 and conductive layer 301. In one embodiment, the polymer of layer 306 and the polymer of porous layer 302 is a ferroelectric polymer. In one embodiment, layer 306 of the polymer is thicker than porous layer 302 and porous layer 304. In one embodiment, layer 306 is formed to the thickness of at least 50 nm. A polymer, e.g., a ferroelectric polymer, is spin cast onto porous layer 304 and exposed portions of porous layer 302 to form porous layer 306. Layer 306 intermixes with exposed portions 305 of porous layer 302 of the polymer, which are not covered by porous layer 304. Layer 306 on porous layer 304 and portions of porous layer 302 may be annealed to generate an appropriate morphology in the polymer. The annealing conditions, e.g., temperature and time, are such that annealing does not damage thin intermixing porous layers 302 and 304. The annealing temperature may be in an approximate range above the Curie point and below the melting point of the polymer. In one embodiment, for layer 306 of polyvinylidene fluoride-co-trifluoroethylene ("PVDF-TrFE"), the annealing temperature is in the approximate range of 120 C to 150 C.

Figure 4:
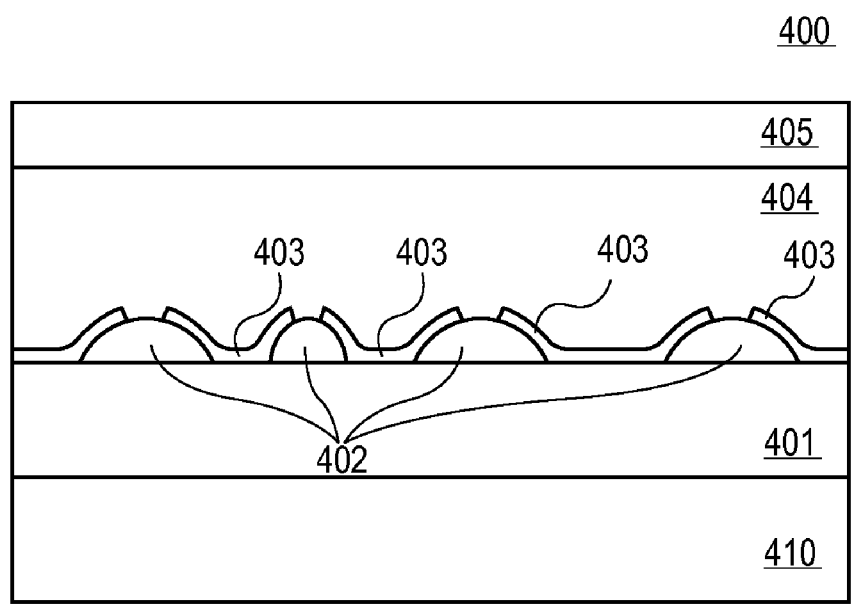
FIG. 4 is a side view of one embodiment of a polymer electronics device, having a bottom electrode.

FIG. 4 is a side view 400 of one embodiment of a polymer electronics device, having a bottom electrode formed as described above with respect to FIGS. 2 and 3. Conductive layer 401 may be optionally formed on substrate 410 as described above with respect to FIG. 3A. In one embodiment, substrate 410 includes silicon oxide. Conductive layer 401 may be formed on substrate 410 using sputtering, deposition, or any other techniques known to one of ordinary skill in the art of electronics device fabrication. In one embodiment, conductive layer 401 includes any material described above with respective to conductive layer 301 of FIGS. 3A-3D. In one embodiment, conductive layer 401 of gold has the thickness in the approximate range of 500 Å to 2000 Å.

As shown in FIG. 4, a porous layer 402 of a polymer is formed on conductive layer 401, as described above with respect to FIG. 3B. In one embodiment, porous layer 402 is a ferroelectric polymer. That is, the charge to the polymer can be read or written by changing the polarization state of the electrodes on either side of the ferroelectric polymer. In one embodiment, porous layer 402 of polyvinylidene fluride-co-trifluoroethylene ("PVDF-TrFE") deposited on conductive layer 401 of gold, has the thickness in the approximate range of 0.1 nm to 100 nm. More specifically, the thickness of porous layer 402 is in the approximate range of 0.1 nm and 10 nm. As shown in FIG. 4, porous layer 403 of a conductive material, e.g., gold, is formed on the porous layer 402 and on exposed portions of conductive layer 401, as described above with respect to FIG. 3C.

In one embodiment, porous layer 403 of gold has the thickness in the approximate range of 10 Å to 100 Å. More specifically, the thickness of porous layer 403 of gold is in the approximate range of 50 Å to 80 Å.

Layer 404 of a polymer, e.g., PVDF-TrFE, is deposited onto porous layer 403 and exposed portions of layer 402, as described above with respect to FIG. 3D. In one embodiment, layer 404 of PVDF-TrFE is formed to the thickness of at least 50 nm.

Porous layer 402 of the polymer and porous layer 403 of a conductive material provide an artificial, mechanical intermixing that increases the interfacial adhesion between polymer layer 404 and conductive layer 401 without any chemical intermixing between polymer layer 404 and conductive layer 401. Conductive layer 401 forms the bottom electrode to polymer layer 404 of the electronic device 400. The interfacial adhesion energy between layer 404 of a ferroelectric polymer and conductive layer 401 of gold, is at least 5 joules/meter^2. As such, an electronics device 400, e.g., a ferroelectric capacitor for electronics memory, can survive manufacturing processing and integration into the semiconductor package. Additionally, the performance of the device 400 is not compromised.

Further, continuous ("non-porous") layer 405 of a conductive material is formed on layer 404 of the polymer to form a top electrode. In one embodiment, conductive layer 405 of gold may be formed on layer 404 of the ferroelectric polymer, e.g., PVDF-TrFE. In one embodiment, conductive layer 405 is thick enough to provide electrical contact and to survive the stress during the other manufacturing operations. For example, the thickness of conductive layer 405 of gold deposited on layer 404 of the ferroelectric polymer may be in the approximate range of 200 Å to 6000 Å. In one embodiment, conductive layer 406 may be deposited onto layer 404 of polymer using, e.g., sputtering or chemical vapor deposition, which are known to one of ordinary skill in the art of electronics device fabrication. In one embodiment, conductive layer 406 may be a metal, e.g., Ag, Au, Ni, Ti, Al, Zn, or any combination of metals known to one of ordinary skill in the art of electronics device fabrication.

Figure 5:
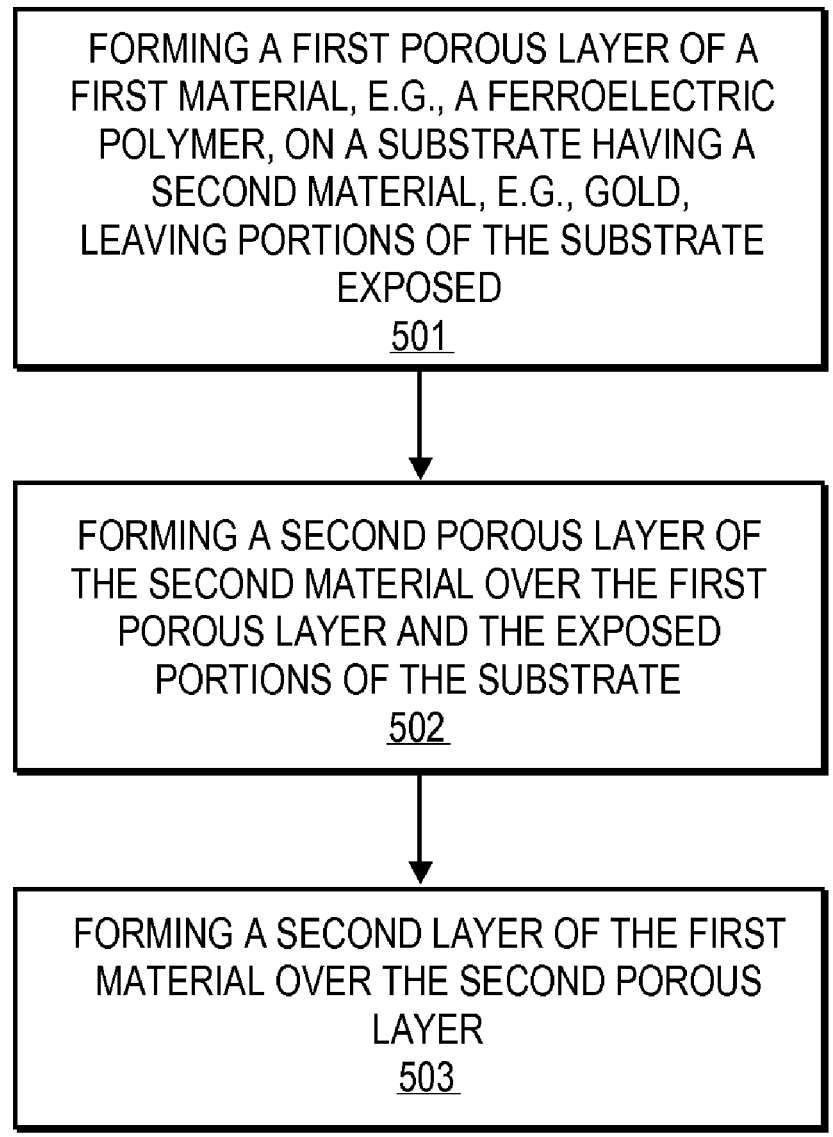
FIG. 5 is a flowchart of one embodiment of a method to provide an artificial, mechanical interfacial mixing at the interface of two materials.

FIG. 5 is a flowchart of one embodiment of a method to provide the artificial interfacial mixing at the interface of two materials, e.g., a ferroelectric polymer and a noble metal. As shown in FIG. 5, the method begins with operation 501 of forming a first porous layer of a first material, e.g., a ferroelectric polymer, on a substrate having a second material, e.g., gold. Forming the first porous layer leaves portions of the substrate exposed, as described above with respect to FIG. 3B. The method continues with operation 502 of forming a second porous layer of the second material over the first porous layer and the exposed portions of the substrate, as described above with respect to FIG. 3C. The method further continues with operation 503 of forming a second layer of the first material over the second porous layer of the second material, as described above with respect to FIG. 3D.

Figure 6:
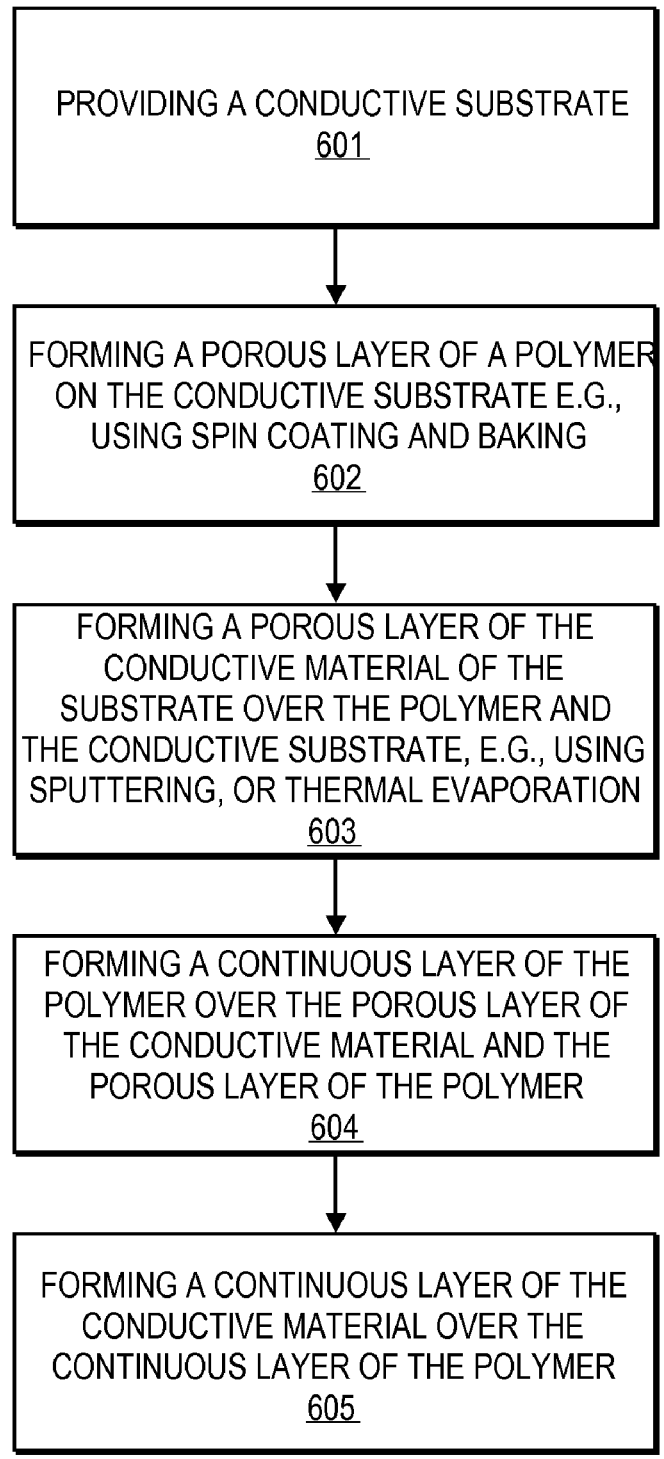
FIG. 6 is a flowchart of one embodiment of a method to form a bottom electrical contact to a polymer.

FIG. 6 is a flowchart of one embodiment of a method to form a bottom electrical contact to a polymer. As shown in FIG. 6, the method begins with operation 601 of providing a conductive substrate, as described above with respect to FIGS. 2-4. In one embodiment, conductive substrate is a gold substrate. Next, in operation 602, forming a porous polymer layer on the conductive substrate is performed, as described above with respect to FIGS. 2-4. The porous polymer layer on the conductive substrate may be formed using spin coating with subsequent baking. Then, in operation 603, a porous conductive layer of the substrate is formed over the porous polymer layer and conductive substrate, as described above with respect to FIGS. 2-4. In one embodiment, the porous conductive layer is formed by sputtering, or thermal evaporation. Next, in operation 604, a continuous ("non-porous") polymer layer is formed over the porous conductive layer and the porous layer of the polymer, as described above with respect to FIGS. 2-4. Further, in operation 605, a continuous conductive layer is formed over the continuous layer of the polymer, as described above with respect to FIG. 4.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic device, comprising:
   a first conductive layer;
   a porous polymer layer having a first plurality of discontinuities over the first conductive layer, wherein first portions of the first conductive layer having a size in a range of 0.1 nanometers (nm) to 10 nm are exposed through the first plurality of discontinuities;
   a porous conductive layer having a second plurality of discontinuities over the porous polymer layer, such that first portions of the porous polymer layer having a size in a range of 1 angstrom (Å) to 100 Å are exposed through the second plurality of discontinuities of the porous conductive layer, and wherein the porous conductive layer has at least a portion directly on first portions of the first conductive layer and another portion directly on the porous polymer layer; and
   a polymer layer over the porous conductive layer, wherein third portions of the polymer layer are in direct contact with the first portions of the porous polymer layer through the second plurality of discontinuities, wherein the porous polymer layer is in direct contact with the first conductive layer.

2. The electronic device of claim 1, wherein the porous conductive layer comprises first continuous portions directly on the porous polymer layer and second continuous portions directly on the first portions of the first conductive layer.

3. The electronic device of claim 1, wherein the porous conductive layer has the thickness from 10 Å to 100 Å.

4. The electronic device of claim 1, further comprising the second conductive layer on the polymer layer.

5. The electronic device of claim 4, wherein the second conductive layer has the thickness from 200 Å to 6000 Å.

6. The electronic device of claim 1, wherein the first conductive layer includes a noble metal.

7. The electronic device of claim 1, wherein the polymer layer includes a ferroelectric.

8. The electronic device of claim 1, wherein the porous conductive layer on the porous polymer layer provide interfacial mixing between the first conductive layer deposited onto the polymer layer, such that on an adhesion energy of the first conductive layer onto the polymer layer is at least 5 joules/meter$^2$.

* * * * *

UNITED STATES PATENT AND TRADEMARK OFFICE
CERTIFICATE OF CORRECTION

PATENT NO. : 7,579,070 B2  Page 1 of 1
APPLICATION NO. : 11/216829
DATED : August 25, 2009
INVENTOR(S) : Lee Rockford It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 126 days.

Signed and Sealed this

Fourteenth Day of September, 2010

David J. Kappos
*Director of the United States Patent and Trademark Office*